US008610173B2

(12) United States Patent
Chini et al.

(10) Patent No.: US 8,610,173 B2
(45) Date of Patent: Dec. 17, 2013

(54) ENHANCEMENT/DEPLETION PHEMT DEVICE

(75) Inventors: Alessandro Chini, Rome (IT); Claudio Lanzieri, Rome (IT)

(73) Assignee: Selex Sistemi Integrati S.p.A., Rome (IT)

( * ) Notice: Subject to any disclaimer, the term of this patent is extended or adjusted under 35 U.S.C. 154(b) by 0 days.

(21) Appl. No.: 13/561,860

(22) Filed: Jul. 30, 2012

(65) Prior Publication Data
US 2013/0062667 A1 Mar. 14, 2013

(30) Foreign Application Priority Data
Aug. 1, 2011 (IT) .............................. TO2011A0713

(51) Int. Cl.
*H01L 27/088* (2006.01)
(52) U.S. Cl.
USPC .................... 257/194; 257/192; 257/E21.403
(58) Field of Classification Search
USPC ......... 257/187, 189, 190, 191, 192, 194, 195, 257/201, E21.403, E27.061, E21.45, 257/E29.317, E21.697, E27.012, E29.249, 257/E21.407
See application file for complete search history.

(56) References Cited

U.S. PATENT DOCUMENTS

| 6,670,652 B2 | 12/2003 | Song |
| 6,703,638 B2 | 3/2004 | Danzilio |
| 7,361,536 B2 | 4/2008 | Hwang |
| 7,541,232 B2 * | 6/2009 | Robinson et al. ............. 438/172 |
| 2006/0027840 A1 | 2/2006 | Wohlmuth |
| 2006/0208279 A1 | 9/2006 | Robinson et al. |
| 2008/0237638 A1 * | 10/2008 | Bito ............................. 257/192 |
| 2008/0251837 A1 | 10/2008 | Kato et al. |
| 2010/0001318 A1 | 1/2010 | Bito |
| 2011/0049526 A1 | 3/2011 | Chu et al. |

FOREIGN PATENT DOCUMENTS

| EP | 0 371 686 | 6/1990 |
| JP | 63 222462 | 9/1988 |
| JP | 2009 032729 | 2/2009 |
| WO | WO 2006/083587 | 8/2006 |

OTHER PUBLICATIONS

Hurm V. et al., "10 Gbit/s monolithic integrated optoelectronic receiver using an MSM photodiode and AlGaAs/GaAs HEMTs" Microelectronic Engineering, Elsevier Publishers BV. Amsterdam, NL., vol. 15, No. 1-4, Oct. 1, 1991.
Chiu et al., High uniformity enhancement and depletion-mode InGaP/InGaAs pHEMTs using a selective succinic acid gate recess process: High uniformity enhancement and depletion-mode InGaP/InGaAs pHEMTs Semiconductor Science and Technology, IOP Publishing Ltd., GB, vol. 21, No. 1, Jan. 1, 2006, pp. 55-59.
Italian Search Report from Italian Application No. IT TO20110713 dated Mar. 9, 2012.

* cited by examiner

*Primary Examiner* — Selim Ahmed
(74) *Attorney, Agent, or Firm* — Workman Nydegger (57) ABSTRACT

An embodiment of the present invention concerns a layered epitaxial structure for enhancement/depletion PHEMT devices, an enhancement/depletion PHEMT device and a method for manufacturing an enhancement/depletion PHEMT device that finds advantageous, but not exclusive, application in the manufacturing of integrated circuits operating at millimeter-wave and microwave frequencies.

6 Claims, 8 Drawing Sheets

ENHANCEMENT/DEPLETION PHEMT DEVICE

CROSS-REFERENCE TO RELATED APPLICATIONS

This application claims priority to Italian Application No. TO2011A000713 filed on 1 Aug. 2011, the contents of which are incorporated herein, in their entirety, by this reference.

TECHNICAL FIELD

Embodiments of the present invention relates, in general, to enhancement/depletion Pseudomorphic High Electron Mobility Transistors (PHEMTs) and, in particular, to an enhancement/depletion PHEMT device and a method for manufacturing enhancement/depletion PHEMT devices that finds advantageous, but not exclusive, application in the production of integrated circuits operating at millimeter-wave and microwave frequencies.

BACKGROUND

As is known, Pseudomorphic High Electron Mobility Transistors (PHEMTs) are widely used in integrated circuits operating at millimeter-wave and microwave frequencies, such as the so-called Monolithic Microwave Integrated Circuits (MMICs).

In particular, PHEMTs are widely exploited in various types of system, such as radio communication systems and radar systems.

In detail, PHEMTs have found wide utilization over the years because they provide high Radio Frequency gain (RF gain), high Power Added Efficiency (PAE) and a low Noise Figure (NF).

SUMMARY

The applicant, in consideration of the excellent properties of PHEMTs that, as previously mentioned, have given rise to extensive usage thereof in various types of systems over the years, has carried out an in-depth study on currently-known enhancement/depletion PHEMT devices.

In particular, the applicant has carried out an exhaustive analysis regarding the characteristics of the enhancement/depletion PHEMT devices described in United States patent applications US 2006/0027840 and US 2006/0208279, in European patent application EP 0371686 and in U.S. Pat. Nos. 6,670,652, 6,703,638 and 7,361,536.

On the basis of the results of said analysis, the applicant felt, thence, the need to develop an innovative enhancement/depletion PHEMT device having superior properties than currently known enhancement/depletion PHEMT devices, in particular the enhancement/depletion PHEMT devices described in United States patent applications US 2006/0027840 and US 2006/0208279, in European patent application EP 0371686 and in U.S. Pat. Nos. 6,670,652, 6,703,638 and 7,361,536; and an innovative method for manufacturing enhancement/depletion PHEMT devices.

Therefore, the object of one or more embodiments of the present invention is that of providing an enhancement/depletion PHEMT device and a method of manufacturing an enhancement/depletion PHEMT device.

This object is achieved by one or more embodiments of the present invention in that the latter relates to a layered epitaxial structure for enhancement/depletion PHEMT devices, to an enhancement/depletion PHEMT device and to a method for manufacturing an enhancement/depletion PHEMT device, according to that defined in the appended claims.

In particular, the layered epitaxial structure for PHEMT devices comprises:
 a superlattice and buffer layer;
 an undoped back-barrier layer formed on the superlattice and buffer layer and made of aluminium gallium arsenide (AlGaAs);
 a doped back delta doping layer formed on the back-barrier layer;
 an undoped back-spacer layer formed on the back delta doping layer and made of aluminium gallium arsenide (AlGaAs);
 an undoped channel layer formed on the back-spacer layer and made of indium gallium arsenide (InGaAs);
 an undoped spacer layer formed on the channel layer and made of aluminium gallium arsenide (AlGaAs);
 a delta doping layer formed on the spacer layer;
 an undoped enhancement barrier layer formed on the delta doping layer;
 a doped first etch stopper layer formed on the enhancement barrier layer and made of aluminium arsenide (AlAs);
 a doped first depletion barrier layer formed on the first etch stopper layer;
 an undoped second depletion barrier layer formed on the first depletion barrier layer;
 a doped second etch stopper layer formed on the second depletion barrier layer and made of aluminium arsenide (AlAs);
 a first cap layer doped with n-type doping, formed on the second etch stopper layer and made of gallium arsenide (GaAs);
 an undoped second cap layer formed on the first cap layer and made of gallium arsenide (GaAs);
 a third etch stopper layer doped with n-type doping, formed on the second cap layer and made of aluminium arsenide (AlAs); and
 an ohmic layer doped with n-type doping, formed on the third etch stopper layer and made of gallium arsenide (GaAs).

Furthermore, the enhancement/depletion PHEMT device according to an embodiment of the present invention comprises:
 the above-stated layered epitaxial structure;
 a first region comprising:
  a first recess vertically formed through the ohmic layer and the third etch stopper layer so as to expose a first upper surface of the second cap layer,
  a second recess that is narrower than the first recess and which vertically extends from the first recess through the second cap layer, the first cap layer and the second etch stopper layer so as to expose a first upper surface of the second depletion barrier layer, and
  a third recess that is narrower than the second recess and which vertically extends from the second recess through the second depletion barrier layer, the first depletion barrier layer and the first etch stopper layer so as to expose an upper surface of the enhancement barrier layer defining a first Schottky contact region;
 a second region laterally spaced apart, and electrically insulated, from said first region and comprising:
  a fourth recess vertically formed through the ohmic layer and the third etch stopper layer so as to expose a second upper surface of the second cap layer, and
  a fifth recess that is narrower than the fourth recess and which vertically extends from the fourth recess through the second cap layer, the first cap layer and the second etch stopper layer so as to expose a second upper surface of the second depletion barrier layer defining a second Schottky contact region;

an enhancement transistor formed in first region and comprising
first source and drain electrodes formed on, and in ohmic contact with, said ohmic layer in the first region externally to the first recess, and
a first gate electrode formed in the third recess in Schottky contact with the upper surface of the enhancement barrier layer defining the first Schottky contact region and extending vertically from said first Schottky contact region through the third, second and first recesses so as to protrude from said first recess; and a depletion transistor formed in second region and comprising:
second source and drain electrodes formed on, and in ohmic contact with, said ohmic layer in the second region externally to the fourth recess, and
a second gate electrode formed in the fifth recess in Schottky contact with the second upper surface of the second depletion barrier layer defining the second Schottky contact region and extending vertically from said second Schottky contact region through the fifth and fourth recesses so as to protrude from said fourth recess.

BRIEF DESCRIPTION OF THE DRAWINGS

For a better understanding of the present invention, some preferred embodiments, provided by way of non-limitative example, will now be illustrated with reference to the attached drawings (not to scale), where.

DETAILED DESCRIPTION

Embodiments of the present invention will now be described in detail with reference to the attached Figures to enable an expert in the field to embody it and use it. Various modifications to the described embodiments will be immediately obvious to experts in the field, and the generic principles described herein can be applied to other embodiments and applications without leaving the scope of protection of the present invention, as defined in the appended claims. Therefore, the present invention should not be considered as limited to the embodiments described and illustrated herein, but be conceded the broadest scope of protection consistent with the principles and characteristics described and claimed herein.

FIGS. 1-6 are schematic section views that illustrate successive manufacturing steps of a first enhancement/depletion PHEMT device according to a first preferred embodiment of the present invention, said first enhancement/depletion PHEMT device being indicated as a whole in said FIGS. 1-6 by reference numeral 1.

Figure 1:
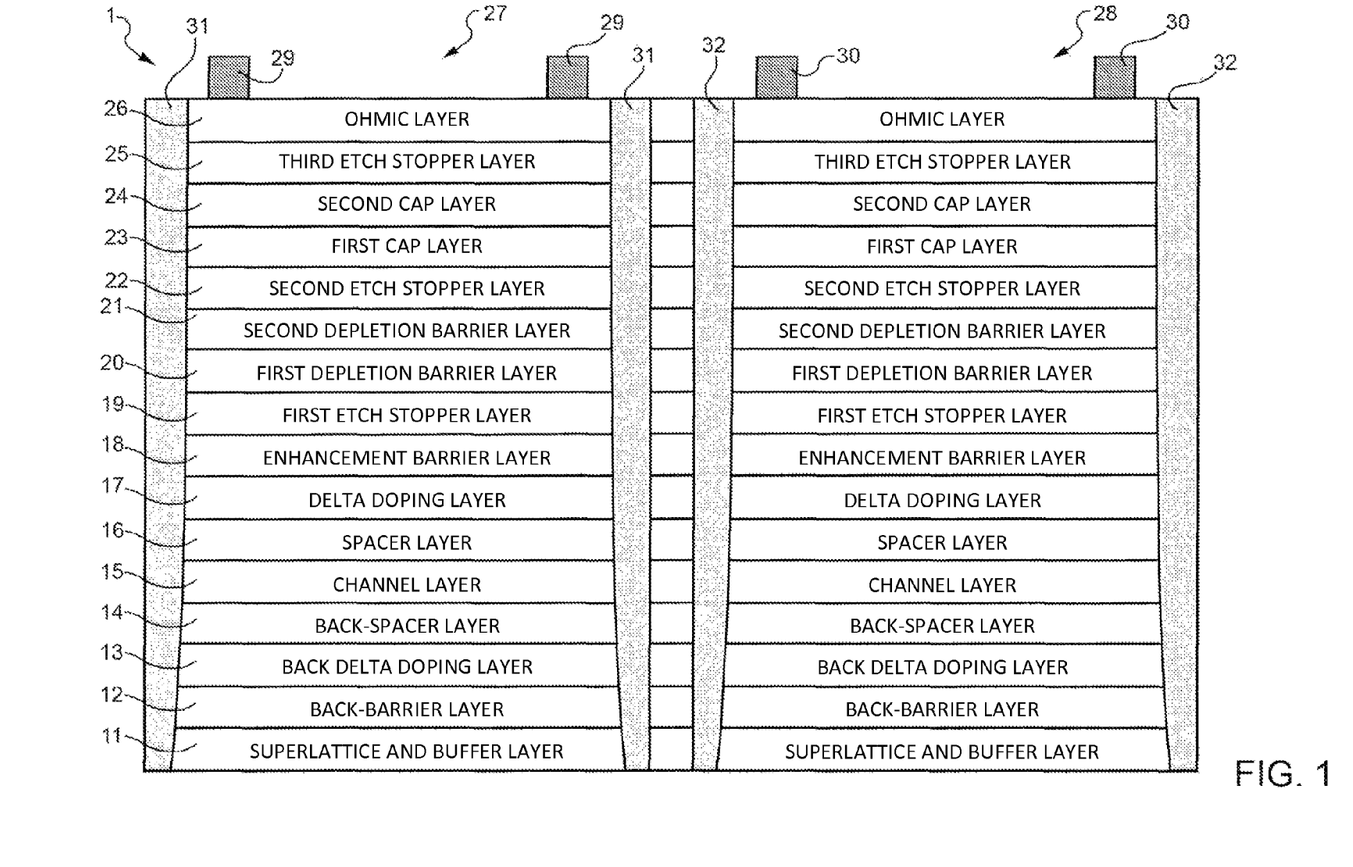
FIGS. 1-6 are schematic section views that illustrate successive manufacturing steps of a first enhancement/depletion PHEMT device according to a first preferred embodiment of the present invention.

In particular, with reference to FIG. 1, the first enhancement/depletion PHEMT device 1 comprises a layered epitaxial structure that includes:

a superlattice and buffer layer 11, the function of which mainly lies in enabling the growth of the layered epitaxial structure described herein and shown in FIG. 1 on semi-insulating gallium arsenide (GaAs) substrates, ensuring effective confinement of electrons in a channel made of indium gallium arsenide (InGaAs) (said InGaAs channel being indicated in FIG. 1 by reference numeral 15 and described in detail below) and avoiding the formation of undesired conductive channels in the layers beneath the indium gallium arsenide (InGaAs) channel; one possible embodiment of said superlattice and buffer layer 11, which in any case envisages multiple alternative solutions, is that of alternating undoped layers of aluminium arsenide (AlAs) and gallium arsenide (GaAs) with thicknesses of around a few tens of nanometers (nm), repeating the growth of these layers roughly ten times; however, it is still possible to also make use of solutions that use layers of aluminium gallium arsenide (AlGaAs) instead of the layers of aluminium arsenide (AlAs) or, in any case, other epitaxial solutions used to eliminate the formation of parasitic electrically conductive channels;

an undoped back-barrier layer 12, formed on the superlattice and buffer layer 11 and made of aluminium gallium arsenide (AlGaAs), said back-barrier layer 12 preferably having a weight concentration of aluminium (Al) within the range of 18%-28% and a thickness greater than 0 nm and less than or equal to 50 nm;

a doped back delta doping layer 13, formed on the back-barrier layer 12, said back delta doping layer 13 having a doping level greater than 0 and less than or equal to $4e^{12}$;

an undoped back-spacer layer 14, formed on the back delta doping layer 13 and made of aluminium gallium arsenide (AlGaAs), said back-spacer layer 14 preferably having a weight concentration of aluminium (Al) within the range of 18%-28% and a thickness within the range of 3-10 nm;

an undoped channel layer 15, formed on the back-spacer layer 14 and made of indium gallium arsenide (InGaAs), said channel layer 15 preferably having a weight concentration of indium (In) within the range of 15%-25% and a thickness within the range of 10-20 nm;

an undoped spacer layer 16, formed on the channel layer 15 and made of aluminium gallium arsenide (AlGaAs), said spacer layer 16 preferably having a weight concentration of aluminium (Al) within the range of 18%-28% and a thickness within the range of 3-10 nm;

a delta doping layer 17 formed on the spacer layer 16; in particular, said delta doping layer 17 can be undoped or doped with a doping level greater than 0 and less than or equal to $4e^{12}$;

an undoped enhancement barrier layer 18, formed on the delta doping layer 17 and made of gallium arsenide (GaAs) (or aluminium gallium arsenide (AlGaAs), preferably with a weight concentration of aluminium (Al) within the range of 18%-28%), said enhancement barrier layer 18 preferably having a thickness greater than 0 nm and less than or equal to 30 nm;

a doped first etch stopper layer 19, formed on the enhancement barrier layer 18 and made of aluminium arsenide (AlAs), said first etch stopper layer 19 preferably having a doping level greater than 0 and less than or equal to $6e^{18}$, and a thickness within the range of 1.5-2.5 nm;

a doped first depletion barrier layer 20, formed on the first etch stopper layer 19 and made of gallium arsenide (GaAs) (or aluminium gallium arsenide (AlGaAs), preferably with a weight concentration of aluminium (Al) within the range of 18%-28%), said first depletion barrier layer 20 preferably having a thickness within the range of 10-30 nm and a doping level greater than 0 and less than or equal to $6e^{18}$;

an undoped second depletion barrier layer 21, formed on the first depletion barrier layer 20 and made of gallium arsenide (GaAs) (or aluminium gallium arsenide (AlGaAs), preferably with a weight concentration of aluminium (Al) within the range of 18%-28%), said second depletion barrier layer 21 preferably having a thickness greater than 0 nm and less than or equal to 10 nm;

a doped second etch stopper layer 22, formed on the second depletion barrier layer 21 and made of aluminium arsenide (AlAs), said second etch stopper layer 22 preferably having a doping level greater than 0 and less than or equal to $6e^{18}$ and a thickness within the range of 1.5-2.5 nm;

a first cap layer 23 doped with n-type doping, formed on the second etch stopper layer 22 and made of gallium arsenide (GaAs), said first cap layer 23 preferably having a doping level within the range of $1\,e^{17}$-$6e^{17}$ and a thickness within the range of 20-50 nm;

an undoped second cap layer 24 formed on the first cap layer 23, said second cap layer 24 preferably having a thickness greater than 0 nm and less than or equal to 10 nm;

a third etch stopper layer 25 doped with n-type doping, formed on the second cap layer 24 and made of aluminium arsenide (AlAs), said third etch stopper layer 25 preferably having a doping level within the range of $1\,e^{18}$-$6e^{18}$ and a thickness within the range of 1.5-2.5 nm; and an ohmic layer 26 doped with n-type doping, formed on the third etch stopper layer 25 and made of gallium arsenide (GaAs), said ohmic layer 26 preferably having a doping level within the range of $1\,e^{18}$-$6e^{18}$ and a thickness within the range of 30-70 nm.

Again with reference to FIG. 1, the first enhancement/depletion PHEMT device 1 also comprises:

a first region 27 in which an enhancement transistor is manufactured, as will be described in detail below;

a second region 28 that is laterally spaced apart from the first region 27 and in which a depletion transistor is manufactured, as will be described in detail below;

a first pair of electrodes 29 comprising a first source electrode and a first drain electrode arranged in the first region 27; said first source electrode being formed on, and in ohmic contact with, a first portion of the ohmic layer 26 extending in the first region 27 and defining a first ohmic contact region; said first drain electrode being formed on, and in ohmic contact with, a second portion of the ohmic layer 26 extending in the first region 27 and defining a second ohmic contact region laterally spaced apart from the first ohmic contact region, in particular preferably set apart at a distance within the range of 3-6 µm; and a second pair of electrodes 30 comprising a second source electrode and a second drain electrode arranged in the second region 28; said second source electrode being formed on, and in ohmic contact with, a third portion of the ohmic layer 26 extending in the second region 28 and defining a third ohmic contact region; said second drain electrode being formed on, and in ohmic contact with, a fourth portion of the ohmic layer 26 extending in the second region 28 and defining a fourth ohmic contact region laterally spaced apart from the third ohmic contact region, in particular preferably set apart at a distance within the range of 3-6 µm.

Preferably said pairs of electrodes 29 and 30 are manufactured by forming a first mask (for simplicity, not shown in FIG. 1) on the ohmic layer 26 so as to leave only the four ohmic contact regions exposed. Said first mask is conveniently formed by means of a layer of photoresist deposited on the ohmic layer 26 and patterned so as to form a respective window on each ohmic contact region. The metallizations of the source and drain electrodes are then deposited on the four ohmic contact regions through the four windows of the first mask and are subjected to an annealing treatment.

After having made the pairs of electrodes 29 and 30, the first region 27 and the second region 28 of the first enhancement/depletion PHEMT device 1 are electrically insulated through ion implantation.

In particular, again with reference to FIG. 1, a first electrical insulation barrier 31 and a second electrical insulation barrier 32 are formed by ion implantation in the layered epitaxial structure external to the first region 27 and the second region 28, respectively, so as to laterally surround, and therefore electrically insulate, said first region 27 and said second region 28, respectively.

The ion implantation is preferably carried out using a second mask (for simplicity, not shown in FIG. 1) formed on the first enhancement/depletion PHEMT device 1 so as to cover the first region 27 and the second region 28, or rather so as to leave exposed the upper surfaces of a fifth and a sixth portion of the ohmic layer 26 that extend externally to said first region 27 and to said second region 28, respectively.

Said second mask is conveniently formed by means of a layer of photoresist deposited on the first enhancement/depletion PHEMT device 1 and patterned so as to form a first opening on the upper surface of the fifth portion of the ohmic layer 26 and a second opening on the upper surface of the sixth portion of the ohmic layer 26. The ion implantation is then carried out so as to implant ions through the two openings of the second mask and into the fifth and sixth portions of the ohmic layer 26 and also into the corresponding underlying portions of all layers of the layered epitaxial structure, i.e. up to the superlattice and buffer layer 11.

Figure 2:
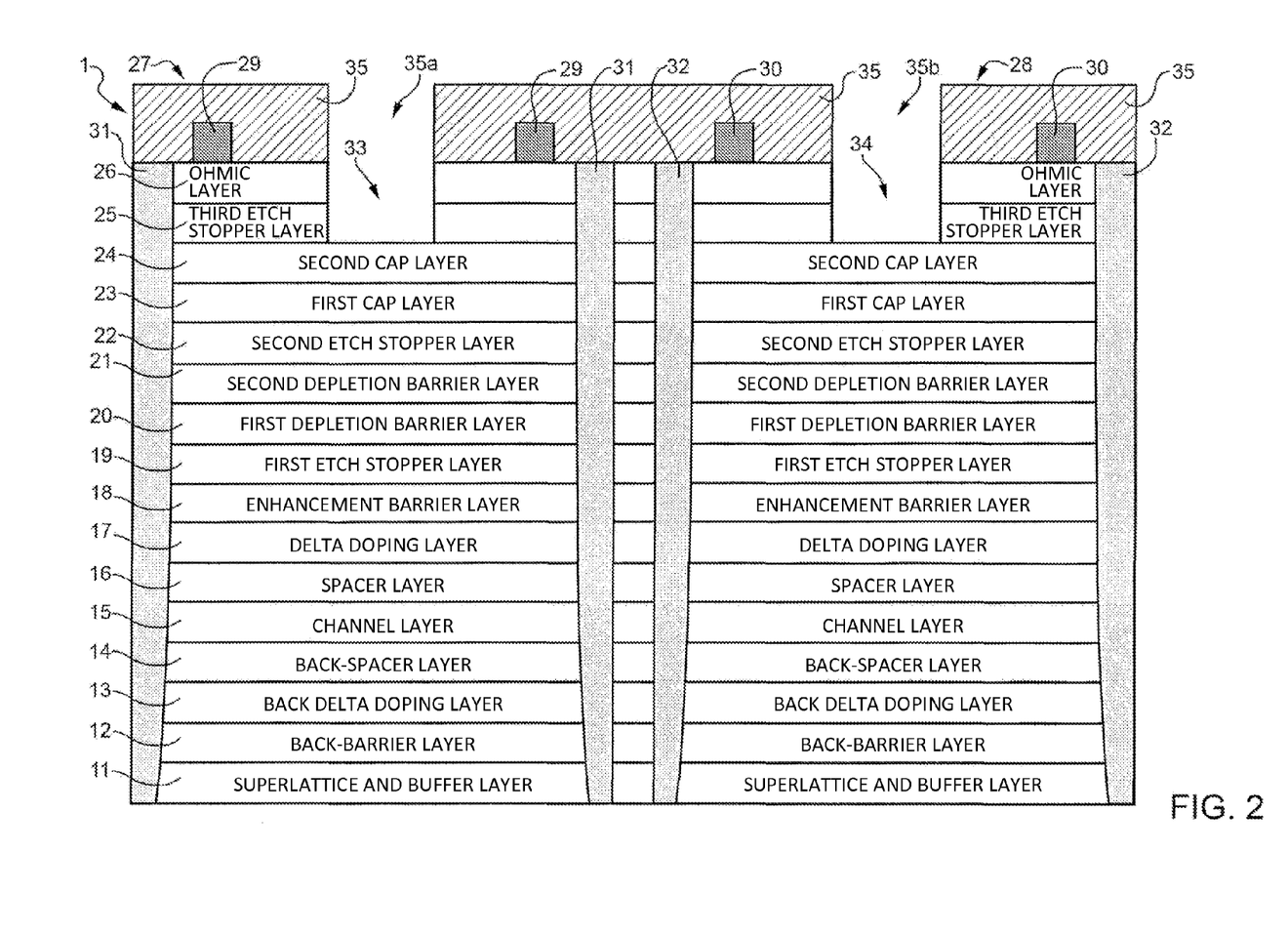

With reference to FIG. 2, after having electrically insulated the first region 27 and the second region 28 of the enhancement/depletion PHEMT device 1, a first recess 33 and a second recess 34 are formed in said first region 27 and in said second region 28, respectively.

In particular, said first recess 33 is formed through a seventh portion of the ohmic layer 26 extending in the first region 27 and laterally spaced apart from the first and second portions of the ohmic layer 26, i.e. from the first and the second ohmic contact regions, and also through a first portion of the third etch stopper layer 25 extending in the first region 27 beneath said seventh portion of the ohmic layer 26, so as to leave exposed an upper surface of a first portion of the second cap layer 24 extending in the first region 27 beneath said first portion of the third etch stopper layer 25.

Furthermore, said second recess 34 is formed through an eighth portion of the ohmic layer 26 extending in the second region 28 and laterally spaced apart from the third and fourth portions of the ohmic layer 26, i.e. from the third and fourth ohmic contact regions, and also through a second portion of the third etch stopper layer 25 extending in the second region 28 beneath said eighth portion of the ohmic layer 26, so as to leave exposed an upper surface of a second portion of the second cap layer 24 extending in the second region 28 beneath said second portion of the third etch stopper layer 25.

In order to form said first recess 33 and said second recess 34, a third mask 35 is preferably formed on the first enhancement/depletion PHEMT device 1 so as to leave only the upper surfaces of the seventh and eighth portions of the ohmic layer 26 exposed.

Said third mask 35 is conveniently formed by means of a layer of photoresist deposited on the first enhancement/depletion PHEMT device 1 and patterned so as to form a first window 35a on the upper surface of the seventh portion of the ohmic layer 26 and a second window 35b on the upper surface of the eighth portion of the ohmic layer 26, said first window 35a and said second window 35b of the third mask 35 having a lateral width preferably within the range of 2-5 µm.

After having formed the third mask 35, the first recess 33 and the second recess 34 are formed by means of a first etching process, dry or wet, carried out through the first window 35a and the second window 35b of said third mask 35.

In particular, said first etching process, which can be carried out by means of a single chemical solution or an opportune sequence of chemical solutions, removes the seventh portion of the ohmic layer 26 and also the underlying first portion of the third etch stopper layer 25, stopping at the interface with the second cap layer 24 so as to leave exposed the upper surface of the first portion of said second cap layer 24 extending in the first region 27 beneath the first portion of the third etch stopper layer 25 removed by said first etching process; and the eighth portion of the ohmic layer 26 and also the underlying second portion of the third etch stopper layer 25, stopping at the interface with the second cap layer 24 so as to leave exposed the upper surface of the second portion of said second cap layer 24 extending in the second region 28 beneath the second portion of the third etch stopper layer 25 removed by said first etching process.

Figure 3:
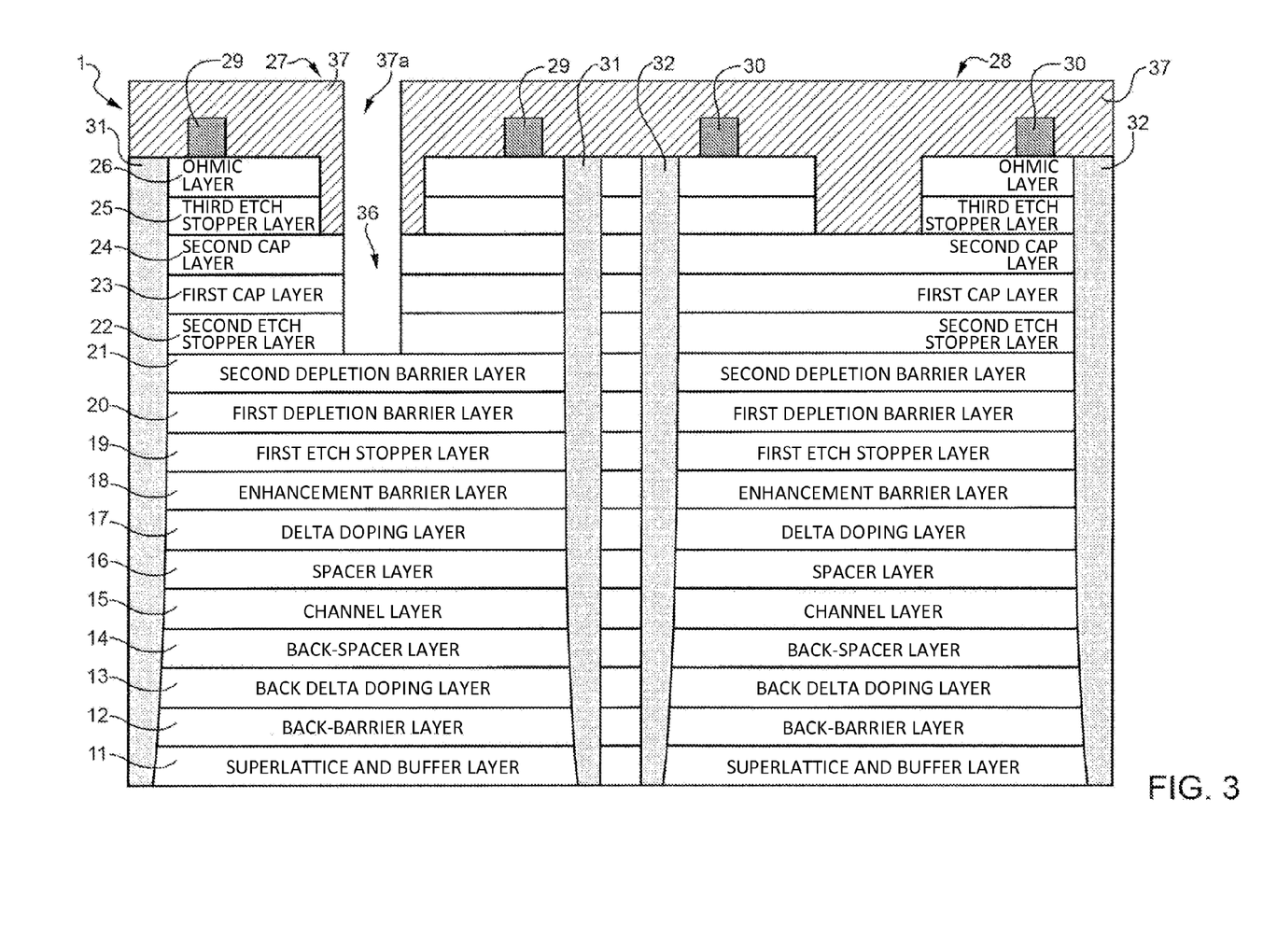

With reference to FIG. 3, after having formed the first recess 33 and the second recess 34, a third recess 36 is formed in the first region 27.

In particular, said third recess 36 is formed through a first sub-portion of the first portion of the second cap layer 24, through a first portion of the first cap layer 23 extending in the first region 27 beneath said first sub-portion of the first portion of the second cap layer 24, and also through a first portion of the second etch stopper layer 22 extending in the first region 27 beneath said first portion of the first cap layer 23, so as to leave exposed an upper surface of a first portion of the second depletion barrier layer 21 extending in the first region 27 beneath said first portion of the second etch stopper layer 22.

In order to form said third recess 36, a fourth mask 37 is preferably formed on the first enhancement/depletion PHEMT device 1 so as to leave exposed only an upper surface of the first sub-portion of the first portion of the second cap layer 24.

Said fourth mask 37 is conveniently formed by means of a layer of photoresist deposited on the first enhancement/depletion PHEMT device 1 and patterned so as to form a window 37a on the upper surface of the first sub-portion of the first portion of the second cap layer 24, said window 37a of the fourth mask 37 having a lateral width preferably within the range of 0.1-0.5 µm.

After having formed the fourth mask 37, the third recess 36 is formed by means of a second etching process, dry or wet, carried out through the window 37a of said fourth mask 37.

In particular, said second etching process, which can be carried out by means of a single chemical solution or an opportune sequence of chemical solutions, removes the first sub-portion of the first portion of the second cap layer 24, the first portion of the first cap layer 23 and also the first portion of the second etch stopper layer 22, stopping at the interface with the second depletion barrier layer 21 so as to leave exposed the upper surface of the first portion of said second depletion barrier layer 21 extending in the first region 27 beneath the first portion of the second etch stopper layer 22 removed by said second etching process.

Figure 4:
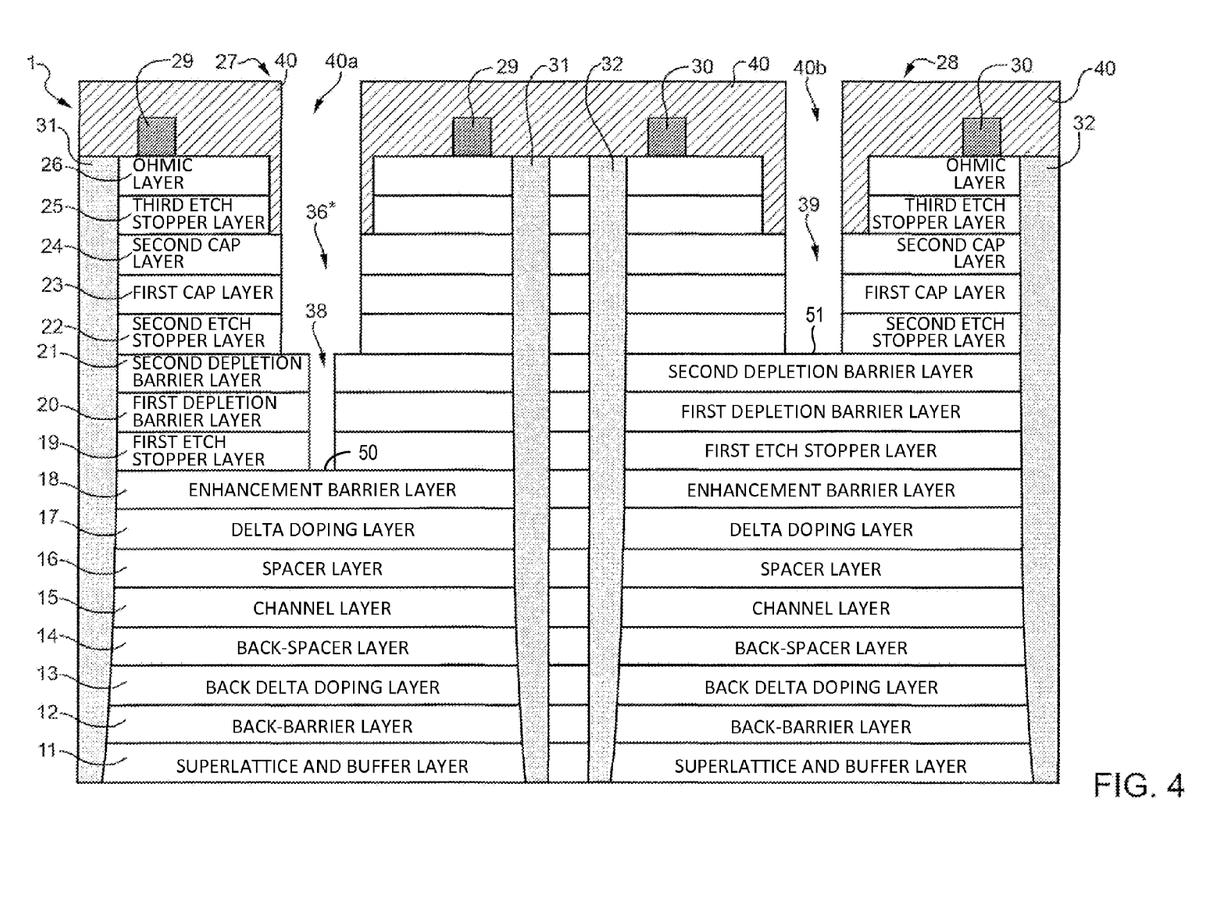

With reference to FIG. 4, after having formed the third recess 36, said third recess 36 is widened, forming a widened third recess 36* extending in the first region 27 and a fourth recess 38 and a fifth recess 39 are simultaneously formed in the first region 27 and in the second region 28, respectively.

In particular, said widened third recess 36* is formed through a second sub-portion of the first portion of the second cap layer 24 that extends in the first region 27 and that, before said widening, laterally surrounds the third recess 36, through a second portion of the first cap layer 23 that extends in the first region 27 beneath said second sub-portion of the first portion of the second cap layer 24 and that, before said widening, laterally surrounds the third recess 36, and also through a second portion of the second etch stopper layer 22 that extends in the first region 27 beneath said second portion of the first cap layer 23 and that, before said widening, laterally surrounds the third recess 36, so as to leave exposed an upper surface of a second portion of the second depletion barrier layer 21 that extends in the first region 27 beneath said second portion of the second etch stopper layer 22, and that, before the formation of the fourth recess 38, laterally surrounds the first portion of the second depletion barrier layer 21, while, after the formation of the fourth recess 38, laterally surrounds said fourth recess 38.

Furthermore, said fourth recess 38 is formed through the first portion of the second depletion barrier layer 21, through a portion of the first depletion barrier layer 20 extending in the first region 27 beneath said first portion of the second depletion barrier layer 21, and also through a portion of the first etch stopper layer 19 extending in the first region 27 beneath said portion of the first depletion barrier layer 20, so as to leave exposed an upper surface of a portion of the enhancement barrier layer 18 that extends in the first region 27 beneath said portion of the first etch stopper layer 19 and defines a first Schottky contact region 50.

Furthermore, said fourth recess 38 is formed through the first portion of the second depletion barrier layer 21, through a portion of the first depletion barrier layer 20 extending in the first region 27 beneath said first portion of the second depletion barrier layer 21, and also through a portion of the first etch stopper layer 19 extending in the first region 27 beneath said portion of the first depletion barrier layer 20, so as to leave exposed an upper surface of a portion of the enhancement barrier layer 18 that extends in the first region 27 beneath said portion of the first etch stopper layer 19 and defines a first Schottky contact region 51.

In order to widen said third recess 36 and to form said fourth recess 38 and said fifth recess 39, a fifth mask 40 is preferably formed on the first enhancement/depletion PHEMT device 1 so as to leave exposed only the upper surfaces of the second sub-portion of the first portion of the second cap layer 24, of the first portion of the second depletion barrier layer 21 and of the first sub-portion of the second portion of the second cap layer 24.

Said fifth mask 40 is conveniently formed by means of a layer of photoresist deposited on the first enhancement/depletion PHEMT device 1 and patterned so as to form a first window 40a on the third recess 36 and the upper surface of the second sub-portion of the first portion of the second cap layer 24 that laterally surrounds said third recess 36; and a second window 40b on the upper surface of the first sub-portion of the second portion of the second cap layer 24. Preferably, said first window 40a and said second window 40b of the fifth mask 40 have a lateral width within the range of 0.2-0.7 µm or even greater.

After having formed the fifth mask 40, the widened third recess 36*, the fourth recess 38 and the fifth recess 39 are formed by means of a third etching process, dry or wet, carried out through the first window 40a and the second window 40b of said fifth mask 40.

In particular, said third etching process, which can be carried out by means of a single chemical solution or an opportune sequence of chemical solutions, removes:

the second sub-portion of the first portion of the second cap layer 24, the second portion of the first cap layer 23 and the second portion of the second etch stopper layer 22, stopping at the interface with the second depletion barrier layer 21 so as to leave exposed the upper surface of the second portion of said second depletion barrier layer 21 extending beneath the second portion of the second etch stopper layer 22 removed by said third etching process;

the first portion of the second depletion barrier layer 21, the underlying portion of the first depletion barrier layer 20 and the underlying portion of the first etch stopper layer 19, stopping at the interface with the enhancement barrier layer 18 so as to leave exposed the upper surface of the portion of said enhancement barrier layer 18 that extends beneath the portion of the first etch stopper layer 19 removed by said third etching process and that defines said first Schottky contact region; and the first sub-portion of the second portion of the second cap layer 24, the third portion of the first cap layer 23 and the third portion of the second etch stopper layer 22, stopping at the interface with the second depletion barrier layer 21 so as to leave exposed the upper surface of the third portion of said second depletion barrier layer 21 that extends beneath the third portion of the second etch stopper layer 22 removed by said third etching process and that defines said second Schottky contact region.

Figure 5:
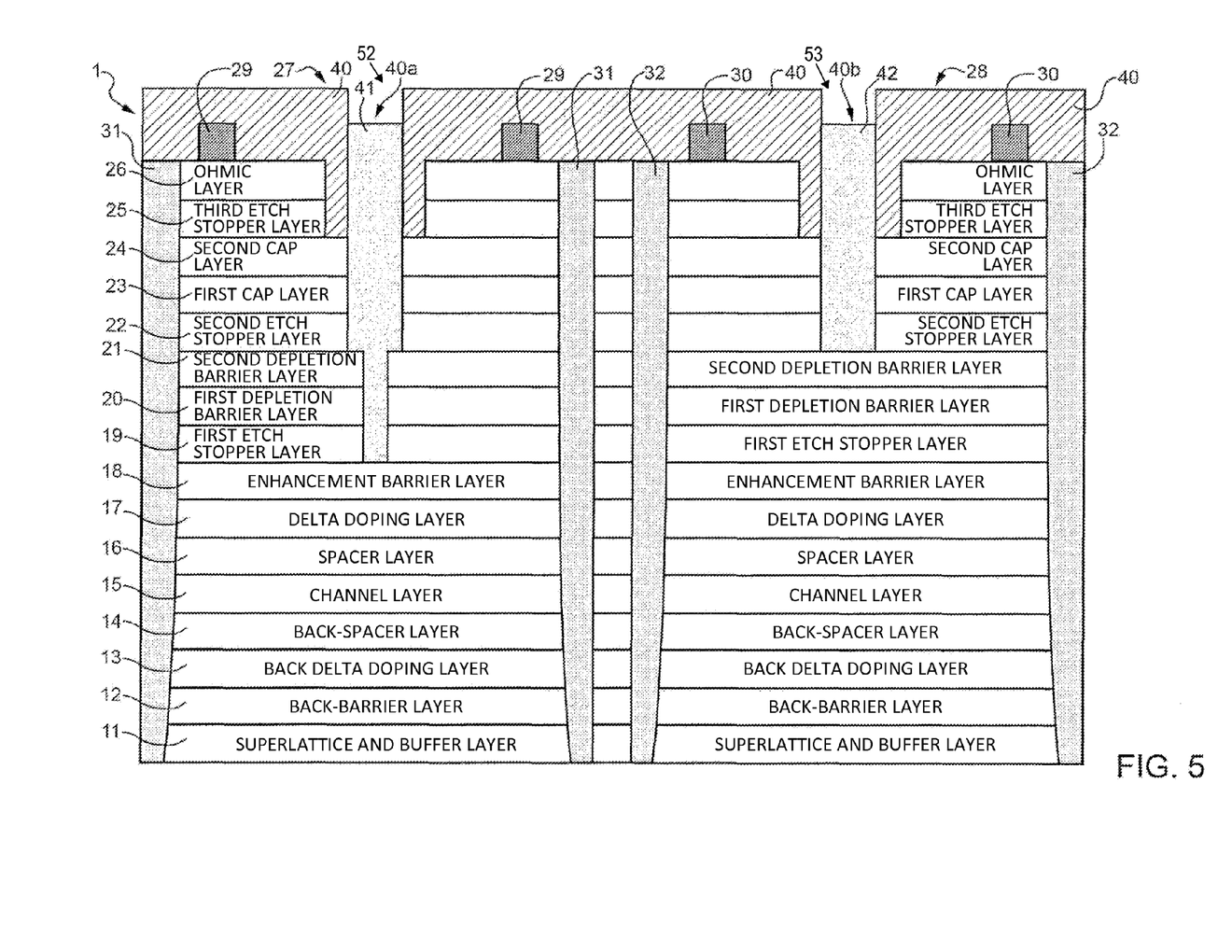
Figure 6:
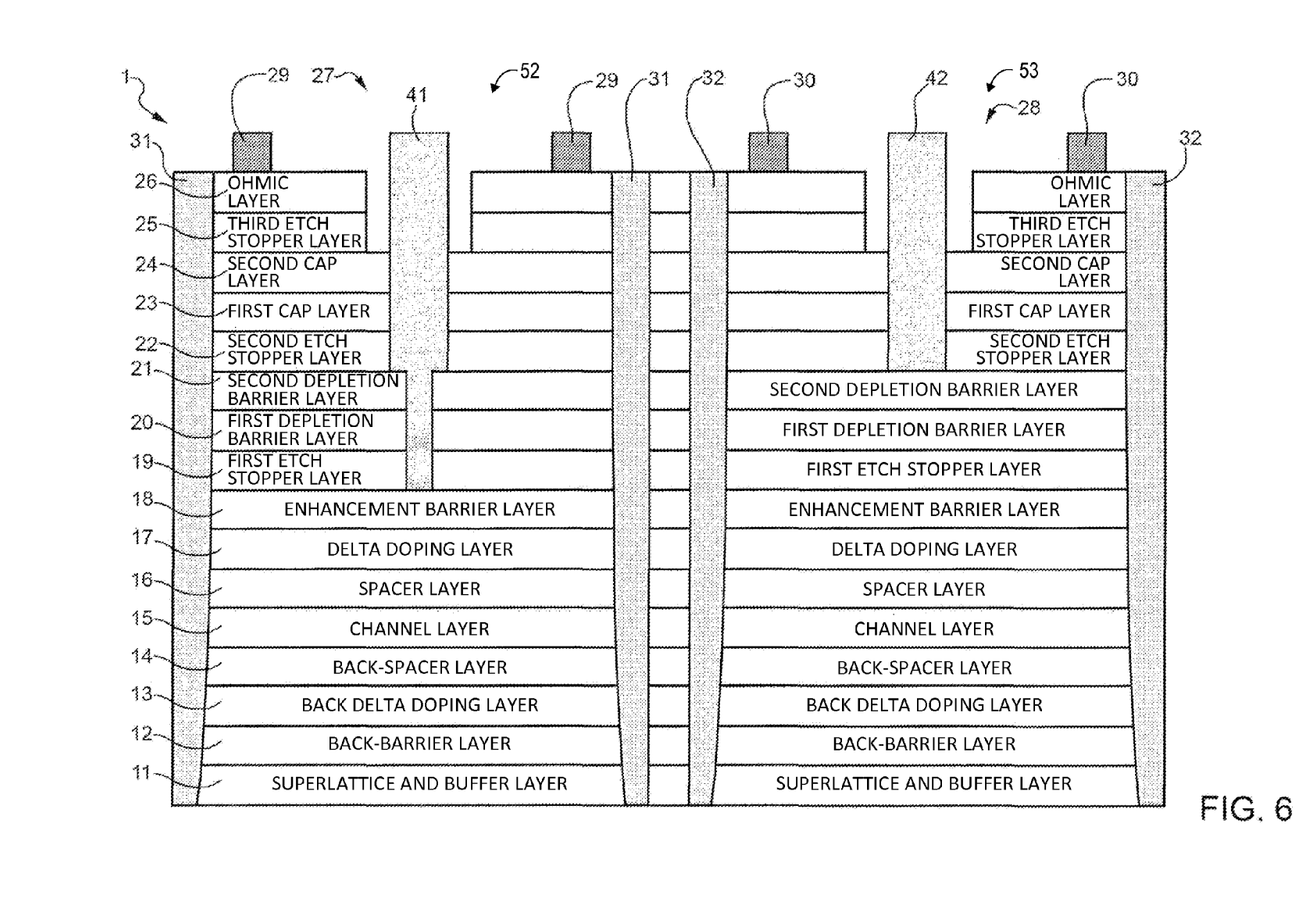

With reference to FIGS. 5 and 6, after having formed the widened third recess 36*, the fourth recess 38 and the fifth recess 39, a first gate electrode 41 and a second gate electrode 42 are formed in the first region 27 and in the second region 28, respectively, thereby making an enhancement transistor 52 in the first region 27 and a depletion transistor 53 in the second region 28.

In particular, said first gate electrode 41 is formed in the fourth recess 38, in the widened third recess 36* and in the first recess 33, and said second gate electrode 42 is formed in the fifth recess 39 and in the second recess 34.

In detail, the first gate electrode 41 is formed so as to comprise a Schottky contact portion that is formed on, and is in Schottky contact with, said portion of the enhancement barrier layer 18 defining the first Schottky contact region, vertically extending through all of the fourth recess 38, and can adhere or not adhere to the lateral walls of the fourth recess 38; and a field plate portion that vertically extends through all of the widened third recess 36* and all of the first recess 33 arriving to protrude in height from said first recess 33, laterally extending on the upper surface of the second portion of the second depletion barrier layer 21 that laterally surrounds the fourth recess 38 so as to rest on and be mechanically supported by said second portion of the second depletion barrier layer 21, and can adhere or not adhere to the lateral walls of the widened third recess 36*.

Furthermore, the second gate electrode 42 is formed on, and is in Schottky contact with, said third portion of the second depletion barrier layer 21 defining the second Schottky contact region, is formed so as to vertically extend through all of the fifth recess 39 and all of the second recess 34 arriving to protrude in height from said second recess 34, and can adhere or not adhere to the lateral walls of the fifth recess 39.

Preferably, as shown in FIG. 5, said gate electrodes 41 and 42 are made using the fifth mask 40.

In particular, the first gate electrode 41 is preferably made by means of chemical vapour deposition self-aligned to the first window 40a of the fifth mask 40 and the second gate electrode 42 is preferably made by means of chemical vapour deposition self-aligned to the second window 40b of said fifth mask 40.

FIG. 6 shows the first enhancement/depletion PHEMT device 1 comprising the enhancement transistor 52 made in the first region 27 and the depletion transistor 53 made in the second region 28 after removal of the fifth mask 40.

Figure 7:
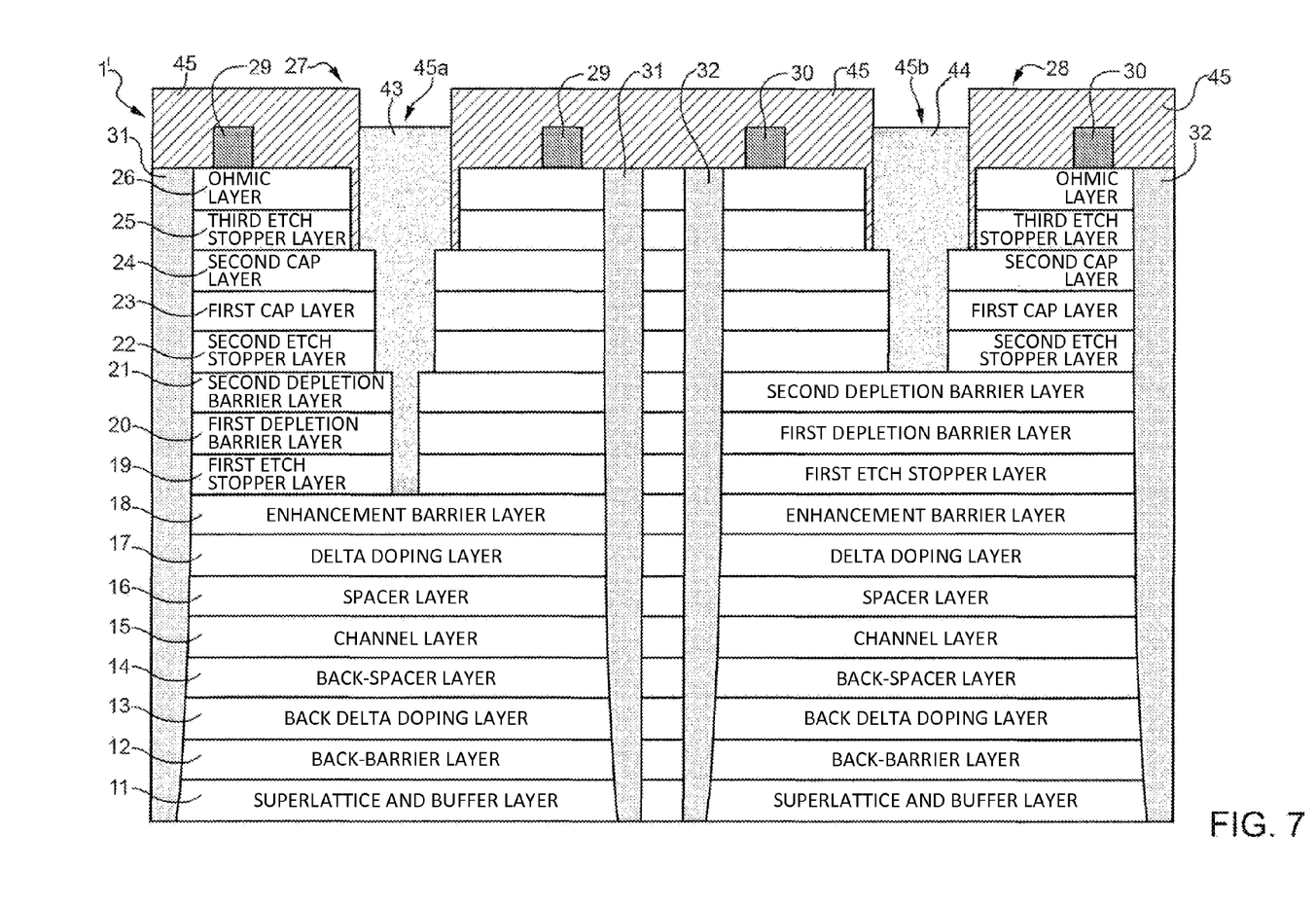
FIGS. 7 and 8 are schematic section views of a second enhancement/depletion PHEMT device according to a second preferred embodiment of the present invention.
Figure 8:
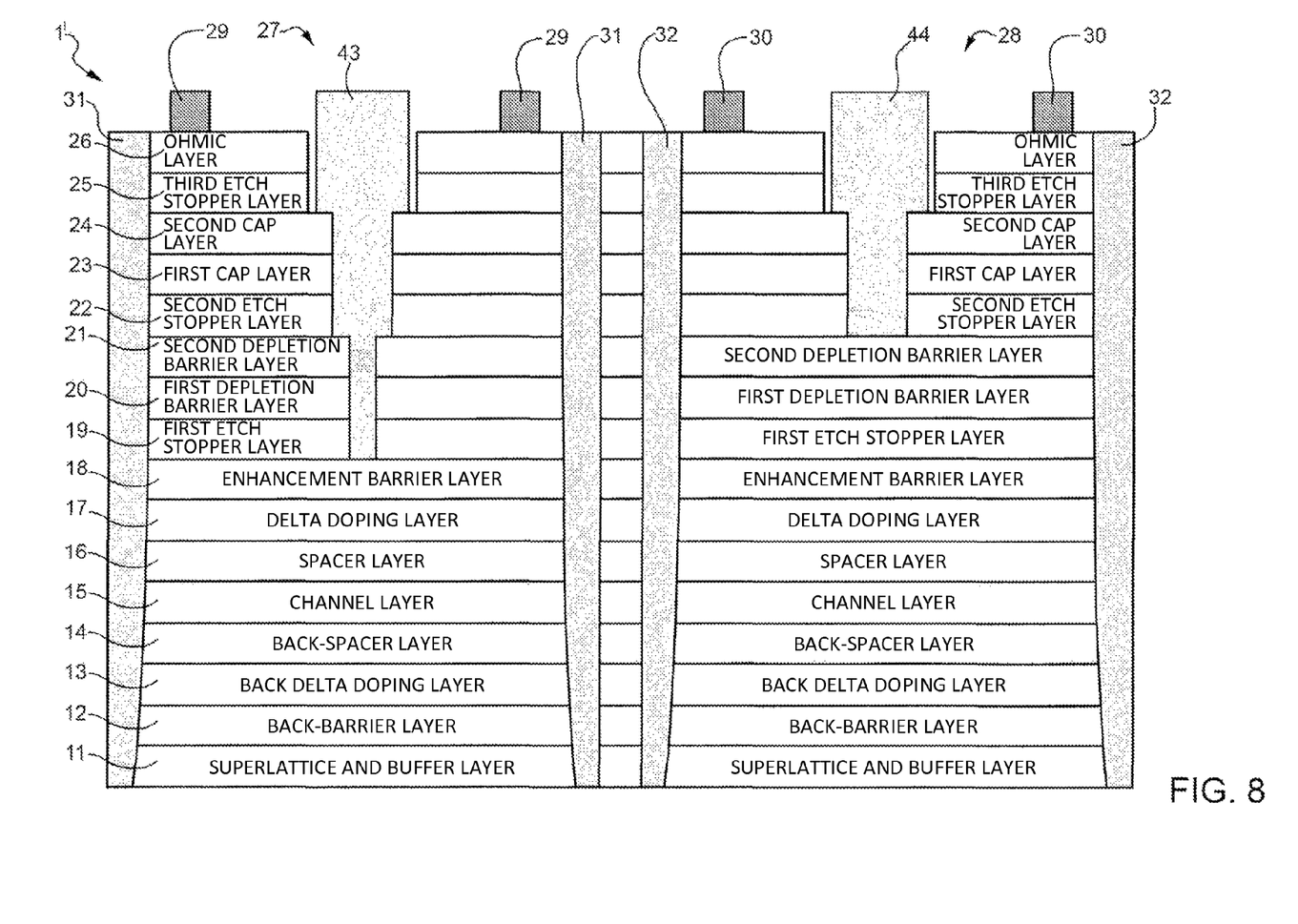

FIGS. 7 and 8 are schematic section views of a second enhancement/depletion PHEMT device made according to a second preferred embodiment of the present invention, said second enhancement/depletion PHEMT device being indicated as a whole in said FIGS. 7 and 8 by reference numeral 1'.

In particular, the second enhancement/depletion PHEMT device 1' is made with the same manufacturing process described in relation to the first enhancement/depletion PHEMT device 1 up to the step of forming the widened third recess 36*, the fourth recess 38 and the fifth recess 39, while the step of forming the gate electrodes of the second enhancement/depletion PHEMT device 1' is different from that previously described in relation to the enhancement/depletion PHEMT device 1.

In detail, with reference to FIGS. 7 and 8, after having formed the widened third recess 36*, the fourth recess 38 and the fifth recess 39, a first gate electrode 43 and a second gate electrode 44 of the second enhancement/depletion PHEMT device 1' are formed in the first region 27 and in the second region 28, respectively, of the second enhancement/depletion PHEMT device 1', thereby making an enhancement transistor in said first region 27 of the second enhancement/depletion PHEMT device 1' and a depletion transistor in said second region 28 of the enhancement/depletion PHEMT device 1'. In particular, said first gate electrode 43 of the enhancement transistor of the second enhancement/depletion PHEMT device 1' is formed in the fourth recess 38, in the widened third recess 36* and in the first recess 33, while said second gate electrode 44 of the depletion transistor of the second enhancement/depletion PHEMT device 1' is formed in the fifth recess 39 and in the second recess 34.

Entering into even greater detail, the first gate electrode 43 of the enhancement transistor of the second enhancement/depletion PHEMT device 1' is formed so as to comprise a respective Schottky contact portion that is formed on, and is in Schottky contact with, said portion of the enhancement barrier layer 18 defining the first Schottky contact region, vertically extending through all of the fourth recess 38, and can adhere or not adhere to the lateral walls of the fourth recess 38; and a respective field plate portion that vertically extends through all of the widened third recess 36* and all of the first recess 33 arriving to protrude in height from said first recess 33, laterally extending on the upper surface of the second portion of the second depletion barrier layer 21 that laterally surrounds the fourth recess 38 so as to rest on and be mechanically supported by said second portion of the second depletion barrier layer 21, also laterally extending on the upper surface of a third sub-portion of the first portion of the second cap layer 24 that laterally surrounds the widened third recess 36* so as to rest on and be mechanically supported by said third sub-portion of the first portion of the second cap layer 24, and can adhere or not adhere to the lateral walls of the widened third recess 36*.

Furthermore, the second gate electrode 44 of the depletion transistor of the second enhancement/depletion PHEMT device 1' is formed so as to comprise a respective Schottky contact portion that is formed on, and is in Schottky contact with, said third portion of the second depletion barrier layer 21 defining the second Schottky contact region, vertically extending through all of the fifth recess 39, and can adhere or not adhere to the lateral walls of the fifth recess 39; and a respective field plate portion that vertically extends through all of the second recess 34 arriving to protrude in height from said second recess 34, and laterally extending on the upper surface of a second sub-portion of the second portion of the second cap layer 24 that laterally surrounds the fifth recess 39 so as to rest on and be mechanically supported by said second sub-portion of the second portion of the second cap layer 24.

Preferably, as shown in FIG. 7, in order to form said gate electrodes 43 and 44 of the second enhancement/depletion PHEMT device 1', a sixth mask 45 is formed on the second enhancement/depletion PHEMT device 1' so as to leave exposed only the upper surfaces of the portion of the enhancement barrier layer 18 defining the first Schottky contact region, of the second portion of the second depletion barrier layer 21 that laterally surrounds the fourth recess 38, of the third sub-portion of the first portion of the second cap layer 24 that laterally surrounds the widened third recess 36*, of the third portion of the second depletion barrier layer 21 defining the second Schottky contact region and of the second sub-portion of the second portion of the second cap layer 24 that laterally surrounds the fifth recess 39.

Said sixth mask 45 is conveniently formed by means of a layer of photoresist deposited on the second enhancement/depletion PHEMT device 1' and patterned so as to form a first window 45a on the widened third recess 36* and the upper surface of the third sub-portion of the first portion of the second cap layer 24 that laterally surrounds said widened third recess 36*; and a second window 45b on the fifth recess 39 and the upper surface of the second sub-portion of the second portion of the second cap layer 24 that laterally surrounds said fifth recess 39.

After having formed the sixth mask 45, the first gate electrode 43 of the enhancement transistor of the second enhancement/depletion PHEMT device 1' is preferably made by means of chemical vapour deposition self-aligned to the first window 45a of the sixth mask 45, and the second gate electrode 44 of the depletion transistor of the second enhancement/depletion PHEMT device 1' is preferably made by means of chemical vapour deposition self-aligned to the second window 45b of said sixth mask 45.

FIG. 8 shows the second enhancement/depletion PHEMT device 1' comprising the enhancement transistor made in the first region 27 and the depletion transistor made in the second region 28 after removal of the sixth mask 45.

One or more embodiments of the present invention have numerous advantages.

In particular, according to an embodiment of the present invention the etch stopper layers 19, 22 and 25, which enable making the first recess 33, the second recess 34, the third recess 36, the widened third recess 36*, the fourth recess 38 and the fifth recess 39 in a controlled manner, are made of aluminium arsenide (AlAs) instead of indium gallium phosphide (InGaP) as in currently known enhancement/depletion PHEMT devices. This innovative characteristic of embodiments of the present invention ensures that the previously described manufacturing processes have high uniformity and high repeatability.

Furthermore, according to an embodiment of the present invention:
  the undoped enhancement barrier layer 18 enables reducing leakage current from the Schottky contact portions of the first gate electrodes 41 and 43 of the enhancement transistors that are formed on, and in Schottky contact with, said enhancement barrier layer 18;
  the undoped second depletion barrier layer 21 enables reducing leakage current from the field plate portions of the first gate electrodes 41 and 43 of the enhancement transistors that rest on and are mechanically supported by said second depletion barrier layer 21;
  the undoped second depletion barrier layer 21 enables reducing leakage current from the Schottky contact portions of the second gate electrodes 42 and 44 of the depletion transistors that are formed on, and in Schottky contact with, said second depletion barrier layer 21; and
  the undoped second cap layer 24 enables reducing leakage current from the field plate portions of the first gate electrode 43 and of the second gate electrode 44 of the second enhancement/depletion PHEMT device 1' that rest on and are mechanically supported by said second cap layer 24.

In addition, the layered epitaxial structure and the manufacturing processes according to the present invention enable preventing the aluminium-based layers from being exposed to air, so as to reduce the phenomena of current breakdown often observed when aluminium-based layers are exposed to air.

Furthermore, the enhancement barrier layer 18, the first depletion barrier layer 20, the second depletion barrier layer 21, the first cap layer 23, the second cap layer 24 and the ohmic layer 26 made, according to a preferred embodiment of the present invention, in gallium arsenide (GaAs) instead of aluminium gallium arsenide (AlGaAs) as in currently known enhancement/depletion PHEMT devices enables obtaining a lower barrier for the electrons that flow between the source and drain contacts in the enhancement transistor channel and in the depletion transistor channel.

Finally, the manufacturing of the field plate portions of the gate electrodes enables reducing the output conductance of the enhancement transistors and the depletion transistors, said output conductance representing a critical factor for the performance of digital circuits.

The invention claimed is:
1. A layered epitaxial structure for enhancement and depletion PHEMT devices, comprising:
  a superlattice and buffer layer;
  an undoped back-barrier layer formed on the superlattice and buffer layer and made of aluminium gallium arsenide (AlGaAs);
  a doped back delta doping layer formed on the back-barrier layer;
  an undoped back-spacer layer formed on the back delta doping layer and made of aluminium gallium arsenide (AlGaAs);
  an undoped channel layer formed on the back-spacer layer and made of indium gallium arsenide (InGaAs);
  an undoped spacer layer formed on the channel layer and made of aluminium gallium arsenide (AlGaAs);
  a delta doping layer formed on the spacer layer;
  an undoped enhancement barrier layer formed on the delta doping layer;

a doped first etch stopper layer, formed on the enhancement barrier layer and made of aluminium arsenide (AlAs);
a doped first depletion barrier layer formed on the first etch stopper layer;
an undoped second depletion barrier layer formed on the first depletion barrier layer;
a doped second etch stopper layer formed on the second depletion barrier layer and made of aluminium arsenide (AlAs);
a first cap layer doped with n-type doping, formed on the second etch stopper layer and made of gallium arsenide (GaAs);
an undoped second cap layer formed on the first cap layer and made of gallium arsenide (GaAs);
a third etch stopper layer doped with n-type doping, formed on the second cap layer and made of aluminium arsenide (AlAs); and
an ohmic layer doped with n-type doping, formed on the third etch stopper layer and made of gallium arsenide (GaAs).

2. The layered epitaxial structure of claim 1, wherein the enhancement barrier layer, the first depletion barrier layer and the second depletion barrier layer are made of gallium arsenide (GaAs).

3. An enhancement/depletion PHEMT device comprising:
the layered epitaxial structure claimed in claim 1;
a first region comprising:
   a first recess vertically formed through the ohmic layer and the third etch stopper layer so as to expose a first upper surface of the second cap layer,
   a second recess that is narrower than the first recess and which vertically extends from the first recess through the second cap layer, the first cap layer and the second etch stopper layer so as to expose a first upper surface of the second depletion barrier layer, and
   a third recess that is narrower than the second recess and which vertically extends from the second recess through the second depletion barrier layer, the first depletion barrier layer and the first etch stopper layer so as to expose an upper surface of the enhancement barrier layer defining a first Schottky contact region;
a second region laterally spaced apart, and electrically insulated, from the first region and comprising:
   a fourth recess vertically formed through the ohmic layer and the third etch stopper layer so as to expose a second upper surface of the second cap layer, and
   a fifth recess that is narrower than the fourth recess and which vertically extends from the fourth recess through the second cap layer, the first cap layer and the second etch stopper layer so as to expose a second upper surface of the second depletion barrier layer defining a second Schottky contact region;
an enhancement transistor formed in the first region and comprising:
   first source and drain electrodes formed on, and in ohmic contact with, the ohmic layer in the first region externally to the first recess, and
   a first gate electrode formed in the third recess in Schottky contact with the upper surface of the enhancement barrier layer defining the first Schottky contact region and extending vertically from the first Schottky contact region through the third, the second and the first recess so as to protrude from the first recess; and
a depletion transistor formed in the second region and comprising:
   second source and drain electrodes formed on, and in ohmic contact with, the ohmic layer in the second region externally to the fourth recess, and
   a second gate electrode formed in the fifth recess in Schottky contact with the second upper surface of the second depletion barrier layer defining the second Schottky contact region and extending vertically from the second Schottky contact region through the fifth and the fourth recess so as to protrude from the fourth recess.

4. The enhancement/depletion PHEMT device of claim 3, wherein the first gate electrode comprises a field plate portion that laterally extends in the second recess on the first upper surface of the second depletion barrier layer so as to rest on and be mechanically supported by the first upper surface of the second depletion barrier layer.

5. The enhancement/depletion PHEMT device of claim 4, wherein the field plate portion of the first gate electrode laterally extends in the first recess on a portion of the first upper surface of the second cap layer so as to rest on and be mechanically supported by the portion of the first upper surface of the second cap layer.

6. The enhancement/depletion PHEMT device according to claim 3, wherein the second gate electrode comprises a field plate portion that laterally extends in the fourth recess on a portion of the second upper surface of the second cap layer so as to rest on and be mechanically supported by the portion of the second upper surface of the second cap layer.

* * * * *